United States Patent
Sato et al.

(10) Patent No.: US 6,534,202 B2
(45) Date of Patent: Mar. 18, 2003

(54) ORGANIC ELECTROLUMINESCENT DEVICE AND PROCESS FOR PRODUCING THE SAME

(75) Inventors: Yoshiharu Sato, Yokohama (JP); Mitsuru Tanamura, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/968,500

(22) Filed: Oct. 2, 2001

(65) Prior Publication Data

US 2002/0037429 A1 Mar. 28, 2002

Related U.S. Application Data

(63) Continuation of application No. PCT/JP01/00719, filed on Feb. 1, 2001.

(30) Foreign Application Priority Data

Feb. 2, 2000 (JP) .......................... 2000-025515
Mar. 17, 2000 (JP) .......................... 2000-076620

(51) Int. Cl.[7] .......................... H05B 33/00; C09K 11/00
(52) U.S. Cl. .......................... 428/690; 428/917; 313/504; 313/506; 427/66
(58) Field of Search .......................... 428/690, 917; 313/506, 504; 427/66

(56) References Cited

U.S. PATENT DOCUMENTS

| | | | |
|---|---|---|---|
| 5,104,749 A | * 4/1992 | Sato et al. | 428/690 |
| 5,364,654 A | * 11/1994 | Hosokawa et al. | 427/66 |
| 5,458,977 A | * 10/1995 | Hosokawa et al. | 428/411.1 |
| 5,739,635 A | * 4/1998 | Wakimoto | 313/504 |
| 6,124,024 A | * 9/2000 | Hosokawa et al. | 428/212 |
| 6,143,434 A | * 11/2000 | Okada | 428/690 |
| 6,172,459 B1 | * 1/2001 | Hung et al. | 313/506 |
| 6,224,966 B1 | * 5/2001 | Sakai et al. | 428/212 |
| 6,338,909 B1 | * 1/2002 | Kwon et al. | 428/690 |
| 2001/0041268 A1 | * 11/2001 | Arai et al. | 428/690 |

FOREIGN PATENT DOCUMENTS

| | | |
|---|---|---|
| JP | 4-212287 | 8/1992 |
| JP | 4-230997 | 8/1992 |
| JP | 5-121172 | 5/1993 |
| JP | 8-264279 | 10/1996 |
| JP | 9-17574 | 1/1997 |
| JP | 11121176 A | * 4/1999 |
| JP | 11-121176 | 4/1999 |
| JP | 2000-182774 | 6/2000 |
| JP | 2000-188184 | 7/2000 |
| JP | 2000-260572 | 9/2000 |
| JP | WO 01/58222 | 8/2001 |

OTHER PUBLICATIONS

T. Wakimoto, et al., IEEE Transactions on Electron Devices, vol. 44, No. 8, pp. 1245–1248, "Organic El Cells Using Alkaline Metal Compounds as Electron Injection Materials", Aug. 1997.

G. E. Jabbour, et al., Applied Physics Letters, vol. 73, No. 9, pp. 1185–1187, "Aluminum Based Cathode Structure for Enhanced Electron Injection in Electroluminescent Organic Devices", Aug. 31, 1998.

* cited by examiner

*Primary Examiner*—Cynthia H. Kelly
*Assistant Examiner*—Dawn Garrett
(74) *Attorney, Agent, or Firm*—Oblon, Spivak, McClelland, Maier & Neustadt, P.C.

(57) ABSTRACT

The invention provides an organic electroluminescent device which is excellent in heat resistance and weather resistance, emits light at a low voltage with high brightness, maintains stable luminescence characteristics in driving, and can be produced under broad process conditions. It comprises a substrate (1) having a luminescent layer (3) held between an anode (2) and a cathode (4). The cathode (4) comprises a metallic material, an alkali metal, and an oxygen atom. The cathode is formed by simultaneous vacuum deposition using a metallic material and an organic compound containing an alkali metal as deposition sources.

27 Claims, 6 Drawing Sheets

5: Protective layer
4: Cathode
3c: Electron transport layer
3b: Hole transport layer
3a: Anode buffer layer
2: Anode
1: Substrate

ORGANIC ELECTROLUMINESCENT DEVICE AND PROCESS FOR PRODUCING THE SAME

This application is a continuation of PCT/JP01/00719, filed Feb. 1, 2001.

BACKGROUND OF THE INVENTION

1. Field of the Invention

This invention relates to an organic electroluminescent device and, more particularly, to a thin film device having a light-emitting layer of an organic compound which emits light upon electric field application.

2. Background Art

Conventional thin film electroluminescent (EL) devices generally comprise an inorganic material, such as a group II–VI compound semiconductor, e.g., ZnS, CaS or SrS, doped with Mn or a rare earth element (e.g., Eu, Ce, Th or Sm) as a luminescence center. EL devices made of these inorganic materials have such disadvantages as (1) necessity of alternating current drive (50 to 1000 Hz), (2) a high driving voltage (up to 200 V), (3) difficulty of full color light emission (particularly in blue), and (4) high cost of peripheral driving circuits.

To eliminate these disadvantages, EL devices using an organic thin film have recently been developed. In particular, in order to raise luminescence efficiency, the kind of an electrode has been optimized for improving efficiency in carrier injection from an electrode. Further, an organic electroluminescent device having a hole transport layer comprising an aromatic diamine and a luminescent layer comprising an aluminum complex of 8-hydroxyquinoline has been developed (*Appl. Phys. Lett.,* vol. 51, p. 913 (1987)). Thus, organic EL devices have shown great improvements on luminescence efficiency over conventional ones comprising single crystals of anthracene, etc. to gain characteristics approaching the level meeting practical use.

In addition to the electroluminescent devices using the above-described low-molecular-weight materials, those using high-molecular-weight materials such as poly(p-phenylenevinylene), poly[2-methoxy-5-(2-ethylhexyloxy)-1,4-phenylenevinylene], and poly(3-alkylthiophene), and those using high-molecular-weight materials, such as polyvinylcarbazole, mixed with low-molecular light-emitting materials and electron transfer materials have also been developed.

Under these circumstances, the outstanding objects relating to organic electroluminescent devices include improvement in driving stability and reduction of driving voltage.

That is, it is a great problem for a light source, such as a backlight of facsimiles, copiers and liquid crystal displays, that an organic electroluminescent device requires a high driving voltage and has low driving stability including heat resistance. This is especially undesirable for such display devices as full color flat panel displays.

Factors of driving instability of organic electroluminescent devices include reduction of luminescent brightness, voltage increase in constant current drive, and development of non-light-emitting parts (dark spots). While there are a number of causes of these instability factors, deterioration of the cathode material, particularly the interface at the light-emitting side of the cathode seems to be a chief cause. In an organic electroluminescent device a metal of low work function, such as a magnesium alloy or calcium, is usually used as a cathode material in order to facilitate electron injection from the cathode into the organic layer. Such a metal is susceptible to oxidation with moisture in air, which is a large factor of driving instability. An electrode made of a low work function metal, while effective in lowering the driving voltage, needs improvements to overcome the above-mentioned instability.

On the other hand, a cathode comprising aluminum containing 0.01 to 0.1 part by weight of metallic lithium has been proposed (an unexamined published Japanese patent application 5-121172). Formation of this cathode requires strict control on the metallic lithium content. However, it is technically difficult to form a cathode layer of an aluminum-lithium alloy having a desired composition by binary vacuum deposition using aluminum and metallic lithium as independent deposition sources. It is conceivable to form a cathode by electron beam deposition or sputtering using a previously prepared pellet or target of an aluminum-lithium alloy having a desired composition. This method, however, involves a practical problem that the composition of the aluminum-lithium alloy deposition source will vary as film formation is repeated due to the differences between lithium and aluminum in vapor pressure or sputtering efficiency. Besides, use of lithium is disadvantageous in that metallic lithium atoms are apt to diffuse into the adjoining organic layer, causing extinction of luminescence and that lithium atoms are so sensitive to moisture that a device having a lithium-containing cathode strictly demands high accuracy of sealing.

A cathode comprising an aluminum alloy containing 6 mol % or more of lithium is also disclosed (an unexamined published Japanese patent application 4-212287). With this cathode, too, a device requires a strict protective film on account of the above-mentioned instability of metallic lithium atoms and cannot get rid of the instability due to diffusion of lithium atoms.

A cathode made of aluminum metal mixed with an alkali metal fluoride has been reported (*Appl. Phys. Lett.*, vol. 73, p. 1185 (1998)), which gives no considerations for device stability.

A two-layered cathode having $Li_2O$ and Al in independent layers has been proposed (*IEEE Transactions on Electron Devices*, vol. 44, No. 8, pp. 1245–1248 (1997)). In this technique, however, because a very thin film of 0.5 to 1.5 nm is used as a cathode interfacial layer, it appears that the film may fail to completely cover the organic layer, and reproducibility seems insufficient. Additionally $Li_2O$ has poor adhesion to an organic layer as compared with Al and may cause formation of dark spots.

Thus, cathode materials heretofore proposed for organic electroluminescent devices include aluminum metal alloyed with lithium or mixed with a lithium compound as stated, but none of them is effective in improving driving stability and reducing a driving voltage, or they involve a practical problem in the process for production.

SUMMARY OF THE INVENTION

An object of the present invention is to settle the above-described problems and to provide an organic electroluminescent device which can be driven at a low voltage with a high luminescence efficiency, maintains stable luminescence characteristics for an extended period of time, and exhibits excellent resistance to heat and weather and a process for easily producing such an organic electroluminescent device without requiring strict condition control.

DETAILED DESCRIPTION OF THE PREFERRED EMBODIMENT

The organic electroluminescent device according to the present invention comprises a substrate having a luminescent layer provided between an anode and a cathode, which is characterized in that the cathode comprises a metallic material, an alkali metal, and an oxygen atom.

The present inventors have conducted extensive studies, seeking for an organic electroluminescent device that exhibits excellent resistance to heat and weather, emits light with high brightness at a low voltage, retains stable luminescence characteristics in driving, and can be produced under a broad range of process conditions. As a result, they have found that the above objects are accomplished by making the cathode of a metallic material containing an alkali metal and an oxygen atom, and completed the present invention.

In the present invention, incorporation of an alkali metal into a cathode makes it possible to lower the work function of the cathode thereby to reduce the energy barrier of the cathode interface for electron injection. As a result, there is produced an effect on lowering the driving voltage of the device. Further, existence of oxygen atoms suppresses diffusion of alkali metal atoms such as lithium atoms into an adjacent layer. Because it already contains oxygen, the cathode is chemically stabilized against the external environment, such as an oxidizing environment. In other words, part of oxygen introduced into the cathode is bonded to the metallic material and/or the alkali metal to form an oxide of the metallic material, in the presence of which the alkali metal atoms are suppressed from diffusing. Existence of carbon atoms enhances affinity to an organic layer to improve the adhesion of the cathode to the organic layer. As a result, there is obtained a device that emits light with high brightness and high efficiency at a low voltage, exhibits stability in driving at a high current density, and hardly undergoes deterioration in storage.

The terminology "metallic material" as used herein is intended to mean a metal except alkali metals or an alloy thereof, which constitutes the main component of a cathode.

The cathode of the invention generally has a metallic material content of 50 to 95 at. %, preferably 60 to 90 at. %; an alkali metal content of 0.1 to 20 at. %, preferably 0.2 to 10 at. %; and an oxygen atom content of 1 to 40 at. %, preferably 3 to 30 at. %. The cathode of the invention is allowed to have a carbon atom content of not more than 30 at. %, preferably not more than 10 at. %, that is, carbon atoms may be incorporated together with some forms of an alkali metal. The metallic material includes one or two or more members selected from the group consisting of aluminum, indium, magnesium, calcium, zinc, vanadium, chromium, tin, and copper, with aluminum or an aluminum alloy being preferred.

The alkali metal which is incorporated into the cathode of the invention usually includes lithium, sodium, potassium, cesium, and mixtures thereof, with lithium and sodium being preferred.

It is preferred that a metal layer containing no alkali metal be provided on the cathode opposite to the luminescent layer.

The organic electroluminescent device according to the invention can easily be produced with no strict restrictions on process conditions by the process of the invention which has the step of forming a cathode according to any one of the following methods (1) to (4):

(1) The cathode is formed by reactive vacuum deposition in an oxidizing atmosphere using a metallic material and an alkali metal as deposition sources. In this method, it is preferable to use an alkali metal nitride as an alkali metal deposition source.

(2) The cathode is formed by vacuum deposition using a metallic material and an alkali metal oxide as deposition sources.

(3) The cathode is formed by reactive sputtering in an oxidizing atmosphere using an alloy composition comprising a metallic material and an alkali metal as a target.

(4) The cathode is formed by sputtering using a composition comprising a metallic material, an alkali metal and oxygen as a target.

By following any one of the methods (1) to (4), a satisfactory cathode can be formed without strict process control because the range of the alkali metal content that promises a device satisfactory luminescence characteristics is broad.

The organic electroluminescent device of the invention can also be produced with ease by the process of the invention with no strict restrictions imposed on process conditions, which process has the step of forming a cathode by simultaneous vacuum deposition of a metallic material and an organic compound containing an alkali metal as deposition sources.

In this process, the organic compound containing an alkali metal partly reacts with the metallic material, such as aluminum, on the substrate upon evaporation in vacuo, whereby the alkali metal is released therefrom and incorporated into the cathode. As a result of the reaction of the organic compound, carbon atoms as well as oxygen atoms are also incorporated into the cathode and exert inhibitory effect on alkali metal diffusion, playing a role in improving stability of the device. In this simultaneous vacuum deposition, because the reaction on the substrate (release of the alkali metal) is a rate-determining step for the amount of the alkali metal atoms to be taken into the metallic material, an alkali metal content that is optimum for a device can be provided from a broad range of the evaporated amount of the alkali metal organic compound. Accordingly, a desired alkali metal content can be obtained only if the amount of the evaporated organic compound is controlled. Thus, compared with conventional methods of forming an alloy cathode, the method of the invention enjoys markedly broadened freedom of process conditions such as evaporation time, furnishing considerable process merits, and is effectively applicable to large-volume production.

BEST MODE FOR CARRYING OUT THE INVENTION

Figure 1:
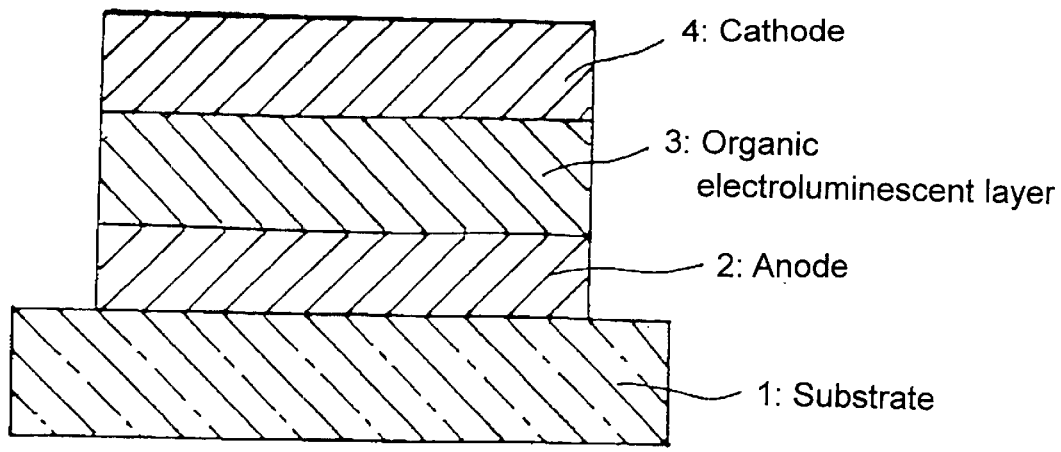
FIG. 1 is a schematic cross-section showing an embodiment of the organic electroluminescent device according to the invention.

The embodiments of the present invention will be described in detail by referring to the drawings.

FIGS. 1 through 5 are schematic cross-sectional views of exemplary structures of the organic electroluminescent devices according to the present invention, in which numeral 1 indicates a substrate; 2, an anode; 3, an organic electroluminescent layer; 3a, an anode buffer layer; 3b, a hole transport layer; 3c, an electron transport layer; 4, a cathode; and 5, a protective layer.

The substrate 1, which is a support of the electroluminescent device, includes a plate of quartz or glass, a metal plate or foil, and a plastic film or sheet. In particular, a glass plate or a plate of a transparent synthetic resin, such as polyester, polymethacrylate, polycarbonate or polysulfone, is preferred. In using a synthetic resin substrate, consideration should be given to gas barrier properties. A substrate having too low gas barrier properties may cause deterioration of the organic electroluminescent device by outer air passing therethrough. Therefore, in using a synthetic resin plate, it is preferred to provide a dense silicon oxide film, etc. on one or both sides of the substrate to secure gas barrier properties.

The anode 2 is provided on the substrate 1. The anode 2 serves for positive hole injection into the organic luminescent layer 3. The anode 2 is usually made up of metals, such as aluminum, gold, silver, nickel, palladium, and platinum; metal oxides, such as an oxide of indium and/or tin; metal halides, such as copper iodide; carbon black; and electrically conductive polymers, such as poly(3-methylthiophene), polypyrrole, and polyaniline. The anode 2 is often formed by sputtering, vacuum deposition or a like method. In using fine particles of metals such as silver, fine particles of copper iodide, carbon black, fine particles of conductive metal oxides, fine particles of conductive polymer, etc., the anode 2 can also be formed by applying the particles as dispersed in an appropriate binder resin solution to the substrate 1. In using a conductive polymer, the anode 2 can also be provided by forming a thin film in situ on the substrate 1 by electrolytic polymerization or by applying the conductive polymer to the substrate 1 (*Appl. Phys. Lett.*, vol. 60, p. 2711 (1922)). It is also possible to form the anode 2 by building up different substances. The thickness of the anode depends on required degree of transparency. Where transparency is required, it is usually desirable for the anode to have a visible light transmission of 60% or more, preferably 80% or more. In this case, the thickness is usually 5 to 1000 nm, preferably about 10 to 500 nm. Where the anode 2 may be opaque, it can be the same as the substrate 2. It is possible to build a different conductive material on the above-described anode 2.

Figure 2:
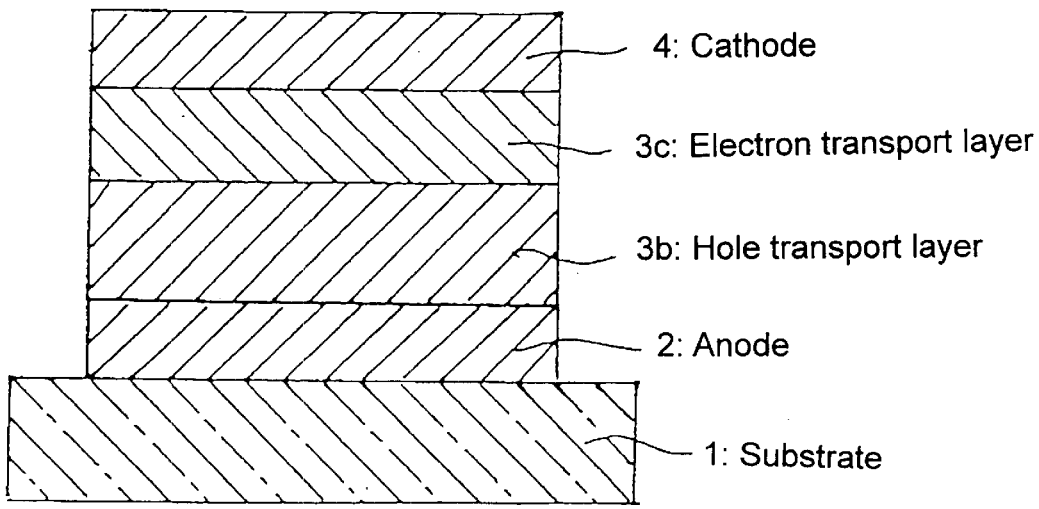
FIG. 2 is a schematic cross-section showing another embodiment of the organic electroluminescent device according to the invention.
Figure 4:
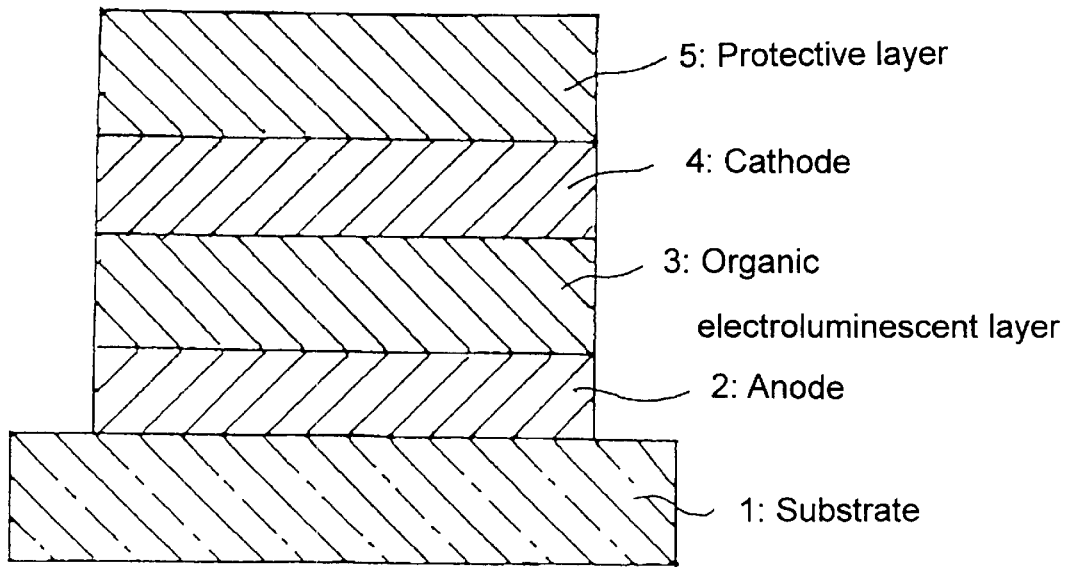
FIG. 4 is a schematic cross-section showing yet another embodiment of the organic electroluminescent device according to the invention.

In the organic electroluminescent derives shown in FIGS. 1 and 4, an organic luminescent layer 3 is provided on the anode 2. The organic luminescent layer 3 is made of a material which efficiently transports positive holes injected from the anode 2 and electrons injected from the cathode 4 between these electrodes with an electric field applied thereby to recombine them and efficiently emits light upon the recombination. It is a practice usually followed for improving luminescence efficiency to divide the organic luminescent layer 3 into a hole transport layer 3b and an electron transport layer 3c to make a device of separated function type as shown in FIG. 2 (*Appl. Phys. Lett.*, vol. 51, p. 913 (1987)).

In the device of separated function type, the hole transport layer 3b should be made of such a material as shows high efficiency in injecting holes from the anode 2 and in transporting the injected holes. For this, the material is required to have a small ionization potential and a large hole mobility, exhibit excellent stability, and allow little impurity as a trap to generate during the preparation or use.

Such hole transporting materials include aromatic diamines containing two or more tertiary amines and having two or more condensed aromatic rings bonded to the nitrogen atoms exemplified by 4,4'-bis[N-(1-naphthyl)-N-phenylamino]biphenyl (an unexamined published Japanese patent application 5-234681), aromatic amine compounds having a starburst structure such as 4,4',4"-tris(1-naphthylphenylamino)triphenylamine (*J. Lumin.*, vols. 72–74, p. 985 (1997)), aromatic amine compounds comprising a triphenylamine tetramer (*Chem. Commun.*, p. 2175 (1996)), and spiro compounds such as 2,2',7,7'-tetrakis(diphenylamino)-9,9'-spirobifluorene (*Synth. Metals*, vol. 91, p. 209 (1997)). These compounds can be used either individually or, if desired, as a mixture of two or more thereof.

Examples of the material of the hole transport layer 3b additionally includes polymeric materials such as polyvinylcarbazole, polyvinyltriphenylamine (an unexamined published Japanese patent application 7-53953), and polyarylene ether sulfone having tetraphenylbenzidine (*Polym. Adv. Tech.*, vol. 7, p. 33 (1966)).

The hole transport layer 3b can be formed by coating the anode 2 with the above-described hole transporting material or depositing the hole transporting material on the anode 2 by vacuum deposition.

In the case of the coating method, a coating solution is prepared by dissolving one or two or more hole transporting materials and, if desired, adding additives, such as a binder resin and a coating property improving agent, that do not trap positive holes, and the coating solution is applied to the anode 2 by spin coating or a like method and dried to form the hole transport layer 3b. The binder resin that can be used include polycarbonate, polyarylate and polyester. Because too much a binder resin reduces hole mobility, the binder resin is desirably added in a small amount, usually of not more than 50% by weight.

In the case of vacuum deposition, the hole transporting material is put into a crucible placed in a vacuum chamber. The vacuum chamber is evacuated with an appropriate vacuum pump to a degree of vacuum of about $10^{-4}$ Pa, and the crucible is then heated. The hole transporting material is thus evaporated and deposited on the anode 2 on the substrate 1 which is set to face the crucible to form the hole transport layer 3b.

The hole transport layer 3b usually has a thickness of 10 to 300 nm, preferably 30 to 100 nm. In order to form such a thin film uniformly, vacuum deposition is commonly adopted.

Figure 3:
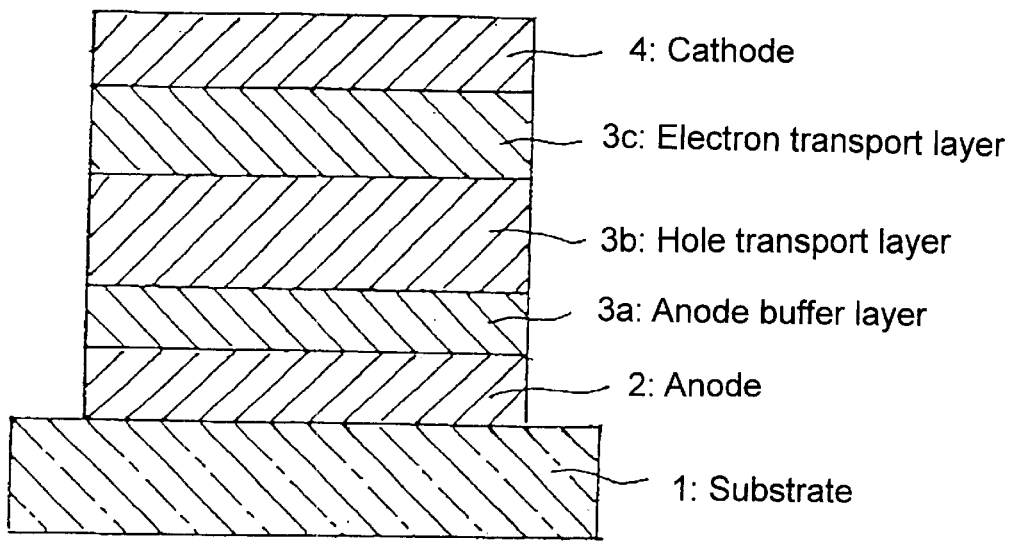
FIG. 3 is a schematic cross-section showing still another embodiment of the organic electroluminescent device according to the invention.

For the purpose of further improving the hole injection efficiency and improving the adhesion of the whole organic layer to the anode, an anode buffer layer 3a can be provided between the hole transport layer 3b and the anode 2 as shown in FIG. 3. The anode buffer layer 3a is effective in dropping the initial driving voltage of the device and to control a voltage increase in continuously driving the device at a constant current. The material used to form the anode buffer layer is required to show good contact with the anode to form a uniform thin film and to have thermal stability, i.e., a high melting point and a high glass transition temperature. Specifically, a melting point of 300° C. or higher and a glass transition temperature of 100° C. or higher are required. The material is also required to have a small ionization potential, be easy to inject positive holes in from the anode, and to have a large positive hole mobility.

Materials reported which meet these requirements include organic compounds such as phthalocyanine compounds, e.g., copper phthalocyanine (an unexamined published Japanese patent application 63-295695), polyaniline (*Appl. Phys. Lett.*, vol. 64, p. 1245 (1994)), and polythiophene (*Optical Materials*, vol. 9, p. 125 (1998)); sputtered carbon film (*Synth. Met.*, vol. 91, p. 73 (1997)); and metal oxides, such as vanadium oxide, ruthenium oxide and molybdenum oxide (*J. Phys. D.*, vol. 29, p. 2750 (1996)).

The anode buffer layer 3a can be formed as a thin film in the same manner as for the hole transport layer 3b. One made of an inorganic substance can also be formed by sputtering, electron beam deposition or plasma-enhanced CVD.

The anode buffer layer 3a thus provided usually has a thickness of 3 to 100 nm, preferably 10 to 50 nm.

On the hole transport layer 3b is provided the electron transport layer 3c. The electron transport layer 3c is for efficiently transporting the electrons afforded from the cathode between the pair of electrodes with an electric field applied towards the hole transport layer 3b. Therefore, an electron transporting compound that can be used in the electron transport layer 3c should have high electron injection efficiency from the cathode 4 and capability of efficiently transporting the injected electrons. For this, the compound is required to exhibit high affinity to electrons, large electron mobility and excellent stability and to allow little impurity to generate during the preparation or use.

Materials fulfilling these requirements include metal complexes such as an aluminum complex of 8-hydroxyquinoline (an unexamined published Japanese patent application 59-194393), a metal complex of 10-hydroxybenzo[h]quinoline (an unexamined published Japanese patent application 6-322362), and bisstyrylbenzene derivatives (an unexamined published Japanese patent application 1-245087 and an unexamined published Japanese patent application 2-222484).

Since all these compounds recited possess both electron transporting properties and light-emitting properties, a layer containing any of them is often a luminescent layer. The electron transport layer, of course, does not need to have light-emitting properties provided that another layer contains a luminescent compound.

While the above-mentioned luminescence is based on utilization of fluorescence of a substance, devices making use of phosphorescence have recently been proposed. It was reported that highly efficient red light emission is possible with a platinum complex (T-1) described below (*Nature*, vol. 395, p. 151 (1998)). Thereafter, doping a luminescent layer comprising a compound (T-3) described below as a host with an iridium complex (T-2) described below achieved a great improvement in green light emission (*Appl. Phys. Lett.*, vol. 75, p. 4 (1999)). Phosphorescence is a light emission phenomenon from an excited triplet state which is generated by hole-electron recombination in a luminescent layer. Considering that conventional fluorescence is via a singlet state, the luminescence efficiency of phosphorescence is expected to be three times as much as that of fluorescence in view of the spin multiplicity.

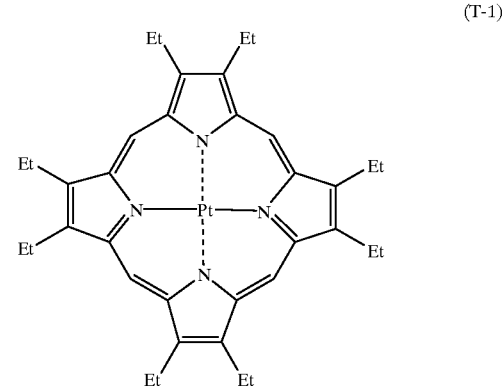
(T-1)

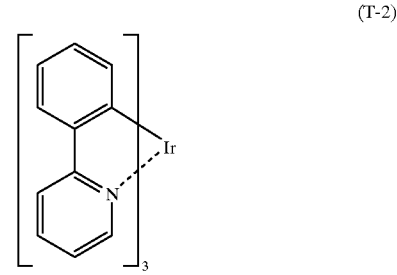
(T-2)

-continued (T-3)

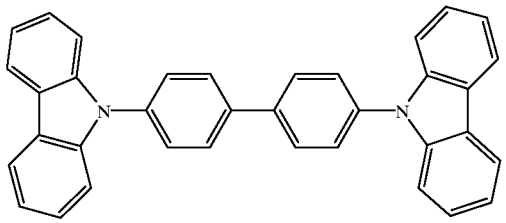

The electron transport layer 3c comprising these compounds generally performs the electron transporting function combined with the function of emitting light on hole-electron recombination. Where the hole transport layer 3b has the light-emitting function, the electron transport layer 3c may have only the function for electron transportation.

The electron transport layer 3c usually has a thickness of 10 to 200 nm, preferably 30 to 100 nm.

The charge transporting layer 3c can be formed in the same manner as for the hole transport layer 3b. Vacuum evaporation is commonly employed.

For the purpose of improving the luminescence efficiency of the device and also altering the color of emitted light, it is known, for example, to dope an aluminum complex of 8-hydroxyquinoline as a host material with a fluorescent dye for a laser, such as coumarin (J. Appl. Phys., vol. 65, p. 3610 (1989)). This method is advantageous in that: (1) the high efficient fluorescent dye brings about improved luminescence efficiency, (2) the luminescence wavelength is variable by selection of the fluorescence dye, (3) a fluorescent dye causing concentration extinction may be used, and (4) a fluorescent dye having poor thin film forming properties may be used.

It is also effective in improving the driving life of the device to dope the above-described luminescent material as a host material with a fluorescent dye. For example, doping a metal complex such as an aluminum complex of 8-hydroxyquinoline as a host material with 0.1 to 10% by weight, based on the host material, of a naphthacene derivative represented by rubrene (Jpn. J. Appl. Phys., vol. 7A, p. L824 (1995)) or a quinacridone derivative (Appl. Phys. Lett., vol. 70, p. 1665 (1995)) greatly improves the luminescence characteristics of a device, particularly the driving stability. Doping a host material of a luminescent layer with a fluorescent dye such as the naphthacene derivative, the quinacridone derivative, etc. can be carried out by simultaneous vacuum deposition or by previously mixing deposition sources at a predetermined concentration ratio.

Materials of the single layer organic luminescent layer 3, not of the separated function type, include the above-recited high-molecular materials, such as poly(p-phenylenevinylene) (Nature, vol. 347, p. 539 (1990), etc.), poly[2-methoxy-5-(2-ethylhexyloxy)-1,4-phenylenevinylene] (Appl. Phys. Lett., vol. 58, p. 1982 (1991), etc.) and poly(3-alkylthiophene) (Jpn. J. Appl. Phys., vol. 30, p. L1938 (1991), etc.) and mixed systems comprising a high-molecular material, e.g., polyvinylcarbazole, a light-emitting material and an electron transfer material (Ohyobuturi, vol. 61, p. 1044 (1992)).

In order to further improve the luminescence efficiency of the organic electroluminescent device, an electron injecting layer can be provided on the organic luminescent layer 3. Compounds which can be used as the electron injecting layer are required to be easy to inject electrons in from the cathode and to have higher ability to transport electrons. Such electron transporting materials include an aluminum complex of 8-hydroxyquinoline that has previously been recited as a luminescent layer material, oxadiazole derivatives (Appl. Phys. Lett., vol. 55, p. 1489 (1989), etc.), a system having these compounds dispersed in a resin such as polymethyl methacrylate (PMMA) (Appl. Phys. Lett., vol. 61, p. 2793 (1992)), and phenanthroline derivatives (an unexamined published Japanese patent application 5-331459). The electron injecting layer usually has a thickness of 5 to 200 nm, preferably 10 to 100 nm.

The cathode 4 plays a role for injecting electrons into the organic luminescent layer 3. The materials used as the cathode 4 in the present invention are characterized by comprising a metallic material which forms the cathode, an alkali metal and an oxygen atom. As previously specified, the metallic material which forms the cathode includes one or two or more members selected from aluminum, indium, magnesium, calcium, zinc, vanadium, chromium, tin, and copper. Aluminum is particularly preferred. The metallic material may be either any one of them or an ally made up of two or more of them. The concentration of the metallic material in the cathode is 50 to 95 at. %, preferably 60 to 90 at. %. The alkali metal concentration in the cathode is 0.1 to 20 at. %, preferably 0.2 to 10 at. %. Where carbon atoms are present, some are bonded to the metallic material and/or the alkali metal, and some do not take participate in such bonding. It is preferred that the total carbon atom concentration in the cathode be 0 to 30 at. %, particularly 10 at. % or less. Similarly, some oxygen atoms are bonded to the metallic material and/or the alkali metal, and some are not. The total oxygen atom concentration in the cathode is preferably 1 to 40 at. %, still preferably 3 to 30 at. %.

In the present invention, incorporation of the alkali metal into the cathode makes it possible to lower the work function of the cathode thereby to reduce the energy barrier of the cathode interface for electron injection. As a result, there is produced an effect on lowering the driving voltage of the device. Further, existence of carbon atoms as well as oxygen atoms suppresses diffusion of the alkali metal atoms into an adjacent layer.

While the methods of forming the cathode having the above composition have been already been described, they are repeated here.

(1) A metallic material and an alkali metal as deposition sources are evaporated by resistance heat or electron beam and co-deposited by reactive vacuum deposition in an active atmosphere containing oxygen. In the case of electron beam evaporation, an alloy composition of the metallic material and the alkali metal can be used as an deposition source. A suitable oxygen partial pressure in vacuum deposition is in a range of from $10^{-3}$ to $10^{-1}$ Pa. For this, an oxygen-containing gas is introduced into a vacuum chamber and adjusted within the above range of pressure, and the metallic material and the alkali metal are evaporated to form a film on a substrate by simultaneous vacuum deposition. While an alkali metal per se may be used as an alkali metal deposition source, it is preferred for safe and stable evaporation to adopt a method in which an alkali metal nitride (e.g., $Li_3N$ or $Na_3N$) is used as an deposition source, which is pyrolyzed to generate an alkali metal, or a method in which an alkali metal chromate (e.g., $Li_2CrO_4$ or $Na_2CrO_4$) is used as an deposition source, which is pyrolyzed to generate an alkali metal. While the alkali metal is oxidized in the oxygen atmosphere in the course of from the deposition source to the substrate and on the substrate and finally converted into an oxide, some part of the alkali metal is incorporated into the film as it is, and some other part is reduced with the metallic material, such as aluminum, to a metal on the substrate. As a result, the resulting cathode partially contains the alkali metal.

(2) An metallic material and an alkali metal oxide are simultaneously vacuum-evaporated by resistance heat or electron beam. In this case, an alkali metal oxide, such as $Li_2O$, $Na_2O$ or $Rb_2O$, is used as an alkali metal oxide deposition source. Similarly to the method (1), this method produces the effect that the alkali metal oxide is partially reduced by the metallic material, such as aluminum, on the substrate to form a cathode of low work function.

(3) The cathode is formed by sputtering using as a target an alloy composition comprising a metallic material and an alkali metal at a desired ratio in a reactive atmosphere containing oxygen. Specifically, the cathode is preferably prepared by sputtering by DC magnetron sputtering or RF magnetron sputtering in an atmosphere comprising Ar gas as a main gas and an adequate amount of oxygen gas. The pressure is preferably about 0.5 to 50 mmTorr ($6.7 \times 10^{-2}$ to 6.7 Pa).

(4) The cathode is formed by sputtering using a composition comprising a metallic material, an alkali metal and oxygen as a target. Specifically, the cathode is preferably prepared by sputtering by DC magnetron sputtering or RF magnetron sputtering in an Ar gas atmosphere. The pressure is preferably about 0.5 to 50 mmTorr ($6.7 \times 10^{-2}$ to 6.7 Pa).

In the methods (1) to (4), the range of the alkali metal atom content in the cathode that affords a device having satisfactory luminescence characteristics is markedly broader (namely, the margin is broader) than in conventional methods of making a cathode of an alkali metal-containing alloy, which furnishes great process advantages.

To form the cathode, it is also possible to adopt a method in which a metallic material and an organic compound containing an alkali metal are used as deposition sources to be deposited simultaneously by resistance heating evaporation or electron beam evaporation. In this method, since an alkali metal is used in the form of an organic compound, the resulting cathode contains carbon atoms. The permissible carbon atom content is 30 at. % at the most as stated previously. Even where the organic compound contains nitrogen atoms, nitrogen atoms do not substantially enter the cathode. A suitable pressure in the vacuum deposition ranges from $10^{-7}$ to $10^{-2}$ Pa.

The organic compound containing an alkali metal is selected from alkali metal complexes or salts. Preferred examples of the organic compounds are shown below.

(1) Alkali metal complexes or salts of 8-hydroxyquinoline, represented by formula (I):

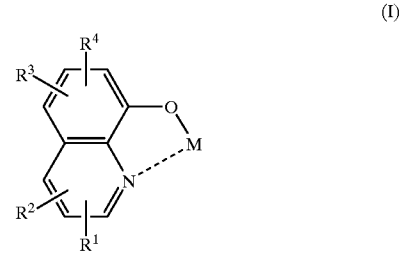

(I)

wherein $R^1$ to $R^4$ each independently represent a hydrogen atom, a halogen atom, an alkyl group, an aralkyl group, an alkenyl group which may have substituent(s), an allyl group, a cyano group, an amino group, an acyl group, an alkoxycarbonyl group, a carboxyl group, an alkoxy group, an alkylsulfonyl group, an α-haloalkyl group, a hydroxyl group, an amido group which may have substituent(s), an aromatic hydrocarbon group which may have substituent(s), or an aromatic heterocyclic group which may have substituent(s); two adjacent substituents among $R^1$ to $R^4$, particularly $R^1$ and $R^2$, or $R^3$ and $R^4$, may form a ring together; and M represents an alkali metal atom.

(2) Alkali metal complexes or salts represented by formula (II):

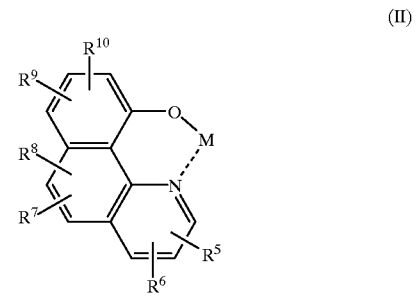

(II)

wherein $R^5$ to $R^{10}$ each independently represent a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylsulfonyl group, an α-haloalkyl group, a hydroxyl group, an amido group which may have substituent(s), an aromatic hydrocarbon group which may have substituent(s) or an aromatic heterocyclic group which may have substituent(s); two adjacent substituents among $R^5$ to $R^{10}$, particularly $R^5$ and $R^6$, $R^7$ and $R^8$, or $R^9$ and $R^{10}$, may form a ring together; and M represents an alkali metal atom.

(3) Alkali metal complexes or salts represented by formula (III):

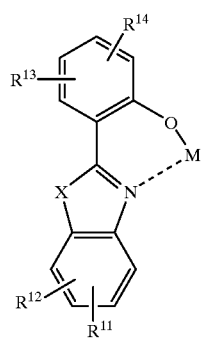

(III)

wherein $R^{11}$ to $R^{14}$ each independently represent a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylsulfonyl group, an α-haloalkyl group, a hydroxyl group, an amido group which may have substituent(s), an aromatic hydrocarbon group which may have substituent(s) or an aromatic heterocyclic group which may have substituent(s); $R^{11}$ and $R^{12}$, or $R^{13}$ and $R^{14}$ may form a ring together; X represents an oxygen atom, a sulfur atom or $NR^{15}$; $R^{15}$ represents a hydrogen atom, an alkyl group or an aromatic hydrocarbon group which may have substituent(s); and M represents an alkali metal atom.

(4) Alkali metal β-diketo complexes or salts represented by formula (IV):

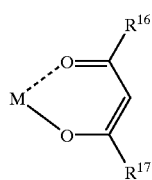

(IV)

wherein $R^{16}$ and $R^{17}$ each independently represent a hydrogen atom, a halogen atom, an alkyl group, an aralkyl group, an alkenyl group, an allyl group, a cyano group, an amino group, an acyl group, an alkoxycarbonyl group, a carboxyl group, an alkoxy group, an alkylsulfonyl group, an α-haloalkyl group, a hydroxyl group, an amido group which may have substituent(s), an aromatic hydrocarbon group which may have substituent(s) or an aromatic heterocyclic group which may have substituent(s); and M represents an alkali metal atom.

(5) Alkali metal carboxylates represented by formula (V):

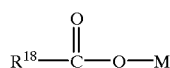

(V)

wherein $R^{18}$ represents an alkyl group, an aralkyl group, an alkenyl group, an allyl group, an aromatic hydrocarbon group which may have substituent(s) or an aromatic heterocyclic group which may have substituent(s); and M represents an alkali metal.

(6) Alkali metal complexes or salts represented by formula (VI):

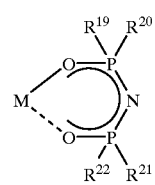

(VI)

wherein $R^{19}$ to $R^{22}$ each independently represent an alkyl group, an aralkyl group, an alkenyl group, an allyl group, an acyl group, an alkoxycarbonyl group, a carboxyl group, an alkoxy group, an alkylsulfonyl group, an aromatic hydrocarbon group which may have substituent(s) or an aromatic heterocyclic group which may have substituent(s); and M represents an alkali metal atom.

Specific but non-limiting examples of preferred alkali metal complexes or salts represented by formulae (I) through (VI) are shown below.

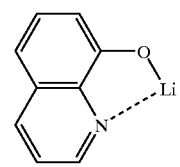

(1-1)

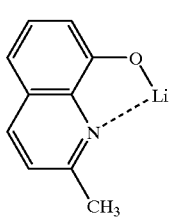

(1-2)

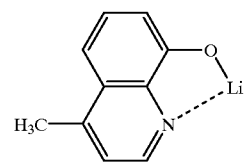

(1-3)

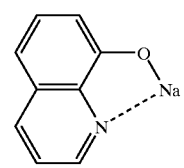

(1-4)

(1-5)
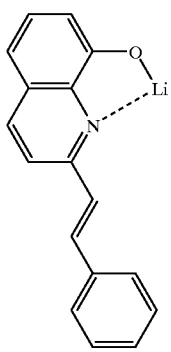
(1-6)
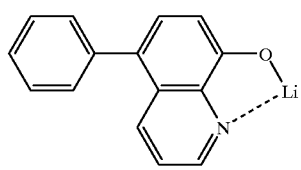
(2-1)
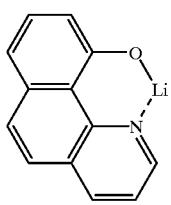
(3-1)
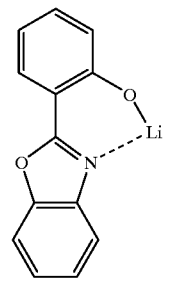
(3-2)
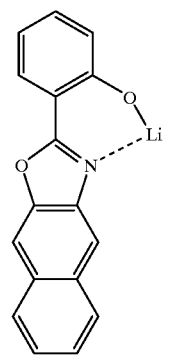
(3-3)
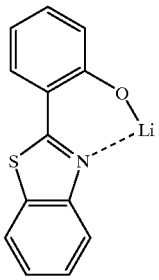
(3-4)
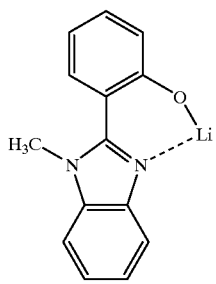
(3-5)
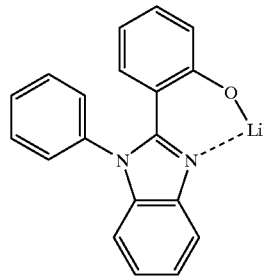
(3-6)
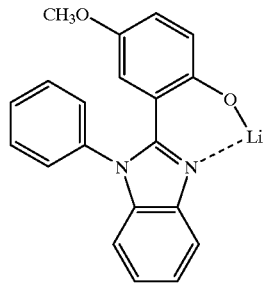
(4-1)
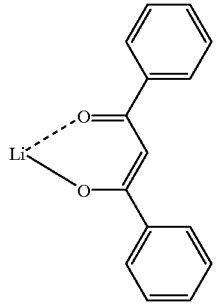

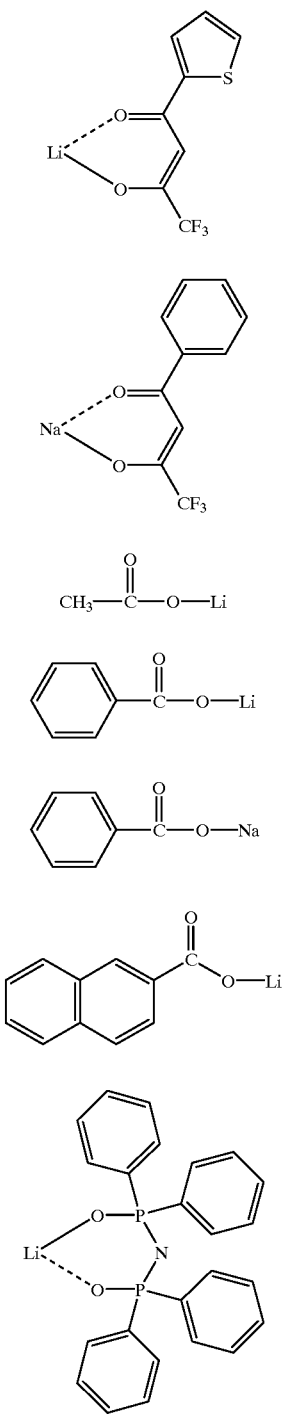

On partially reacting with the metallic material such as aluminum on the substrate in vacuum deposition, the alkali metal organic compound releases the alkali metal, which is incorporated into the cathode. As a result of the reaction, the cathode contains both carbon atoms and oxygen atoms, which are effective in suppressing diffusion of the alkali metal thereby enhancing the stability of the device. In this simultaneous vacuum deposition of the metallic material and the organic alkali metal compound, because the reaction on the substrate (release of the alkali metal) is a rate-determining step for the amount of the alkali metal atoms to be incorporated into the metallic material, an alkali metal content that is optimum for a device can be obtained for a broad range of the evaporated amount of the organic alkali metal compound. Accordingly, compared with conventional methods of forming an alloy cathode, the method of the invention enjoys markedly broadened freedom of process conditions, furnishing considerable process merits, and is effectively applicable to large-volume production.

The thickness of the cathode 4 is the same as the anode 2.

Figure 5:
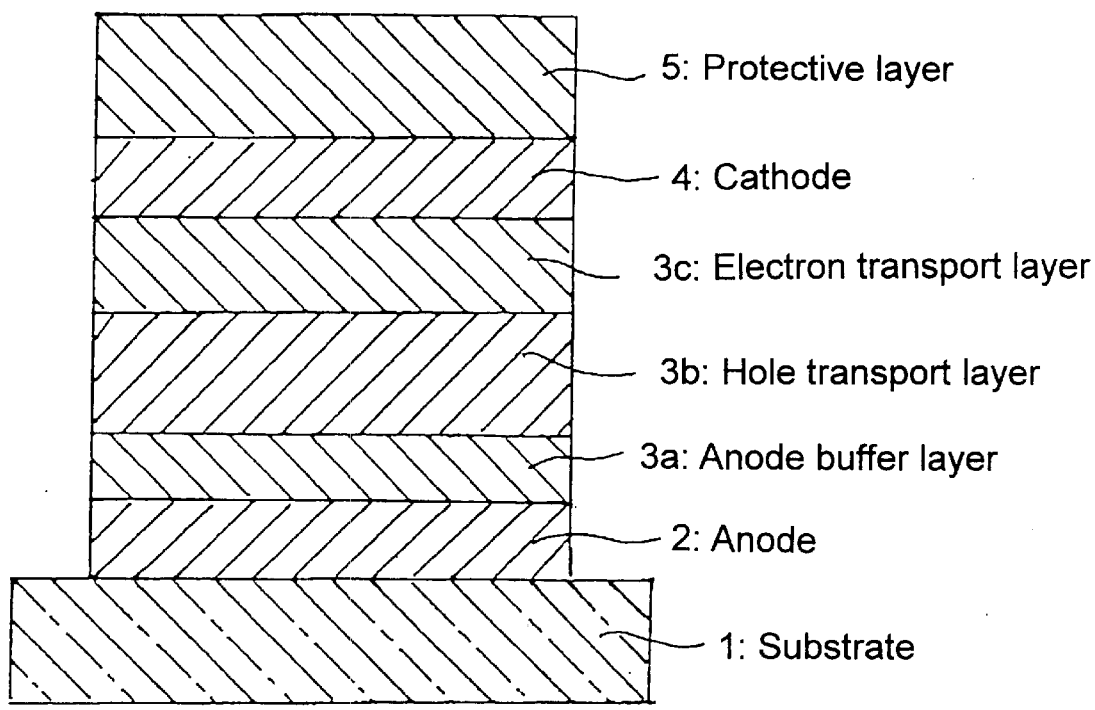
FIG. 5 is a schematic cross-section showing a different embodiment of the organic electroluminescent device according to the invention.

It is preferred for increasing the device stability that a protective layer 5 made of a metallic material having a high work function and stable to the air be provided on the cathode 4 for the purpose of protecting the cathode 4 as shown in FIGS. 4 and 5. The metallic material used in the protective layer 5 may be the same as or different from the metallic material used in the cathode 4. The metallic material used for this purpose preferably includes aluminum, copper, chromium, gold, and silver. The protective layer 5 usually has a thickness of about 10 nm to 1 $\mu$m.

FIGS. 1 to 5 are illustrative of the embodiments of the organic electroluminescent device according to the present invention and are by no means limiting the constitution of the organic electroluminescent device of the invention. For example, the device can have an inverted structure of the one shown in FIG. 1, namely, may have the cathode 4, the organic luminescent layer 3 and the anode 2 on the substrate 1 in this order. As previously noted, the organic electroluminescent device can be provided in between two substrates at least one of which is highly transparent. Similarly, the organic electroluminescent devices shown in FIGS. 2, 3, 4 and 5 can have the constituent layers in the reversed order.

EXAMPLES

The present invention will now be illustrated in greater detail with reference to Examples and Comparative Examples, but the present invention is not limited thereto.

Example 1

An organic electroluminescent device having the structure shown in FIG. 5 was prepared according to the following procedures.

A glass substrate 1 having deposited thereon a 120 thick transparent indium-tin oxide (ITO) conductive film film formed by electron beam evaporation, available from Geomatic Co.; sheet resistivity: 15 $\Omega$) was treated by a general photolithographic technique and etching with hydrochloric acid to form a cathode 2 in a pattern of stripes having a width of 2 mm. The patterned ITO substrate was cleaned by ultrasonication in acetone, followed by washing with pure water, and followed by ultrasonication in isopropyl alcohol, dried by nitrogen blowing, and finally cleaned with ultraviolet ozone. The cleaned substrate was set in a vacuum deposition apparatus.

The apparatus was roughly evacuated with an oil rotary pump and then further evacuated with an oil diffusion pump equipped with a liquefied nitrogen trap to obtain a degree of vacuum of $2\times10^{-6}$ Torr (about $2.7\times10^{-4}$ Pa) or less. Copper phthalocyanine (crystal form: β-form) shown below in a molybdenum boat placed in the apparatus was then heated to conduct vacuum deposition. Vacuum evaporation was carried out at a degree of vacuum of $2\times10^{-6}$ Torr (about $2.7\times10^{-4}$ Pa) for an evaporation time of 1 minute to form an anode buffer layer 3a having a thickness of 10 nm.

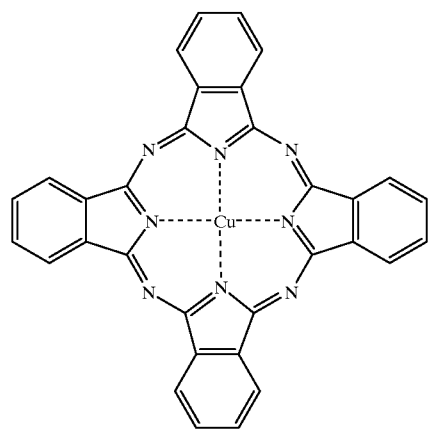

Then, 4,4'-bis[N-(1-naphthyl)-N-phenylamino]biphenyl shown below in a ceramic crucible set in the apparatus was heated by a tantalum wire heater provided around the crucible to conduct vacuum deposition. The crucible temperature was controlled within a range of 250 to 260° C. Vacuum evaporation was carried out at a degree of vacuum of $1.7\times10^{-6}$ Torr (about $2.3\times10^{-4}$ Pa) for an evaporation time of 3 minutes and 30 seconds to form a hole transport layer 3b having a thickness of 60 nm.

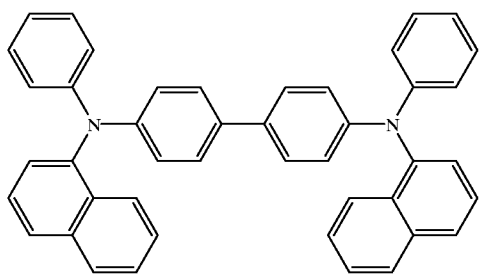

Subsequently, an aluminum complex of 8-hydroxyquinoline having the following structural formula $Al(C_9H_6NO)_3$, which is an electron transporting material having a luminescent function, was vacuum evaporated in the same manner as for the hole transport layer 3b. Vacuum evaporation was effected at a degree of vacuum of $1.3\times10^{-6}$ Torr (about $1.7\times10^{-4}$ Pa) for an evaporation time of 3 minutes and 10 seconds while controlling the temperature of the crucible containing the aluminum complex of 8-hydroxyquinoline within a range of 270 to 300° C. to form an electron transport layer 3c having a thickness of 75 nm.

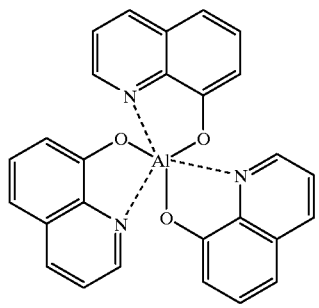

The substrate temperature was kept at room temperature during formation of the anode buffer layer 3a, the hole transport layer 3b and the electron transport layer 3c by vacuum deposition.

The device having formed thereon layers up to the electron transport layer 3c was once taken out of the vacuum deposition apparatus into the air. A shadow mask for cathode deposition having a 2-mm wide stripe pattern was brought into close contact with the device with the stripes thereof crossing the stripes of the ITO anode 2, and the device with the mask was placed in another vacuum deposition apparatus. The apparatus was evacuated to a degree of vacuum of $2\times10^{-6}$ Torr (about $2.7\times10^{-4}$ Pa) or less in the same manner as for the organic layer formation. Aluminum was evaporated at a deposition rate of 0.3 nm/sec and, at the same time, the Li organic compound (1-1) was evaporated by heating at a controlled temperature of 350° C. at a deposition rate of 10% based on the aluminum deposition rate to form a cathode 4 to a film thickness of 10 nm by binary simultaneous vacuum deposition. The evaporation time was 30 seconds. The degree of vacuum during deposition was $1.2\times10^{-5}$ Torr (about $1.6\times10^{-3}$ Pa). Subsequently, without breaking the vacuum of the apparatus, aluminum in a molybdenum boat was further evaporation deposited to a film thickness of 70 nm to form a protective layer 5. The degree of vacuum in the aluminum deposition was $1.0\times10^{-5}$ Torr (about $1.3\times10^{-3}$ Pa), and the evaporation time was 4 minutes. The substrate was kept at room temperature while the double-layered cathode was being formed by vacuum deposition.

Figure 6:
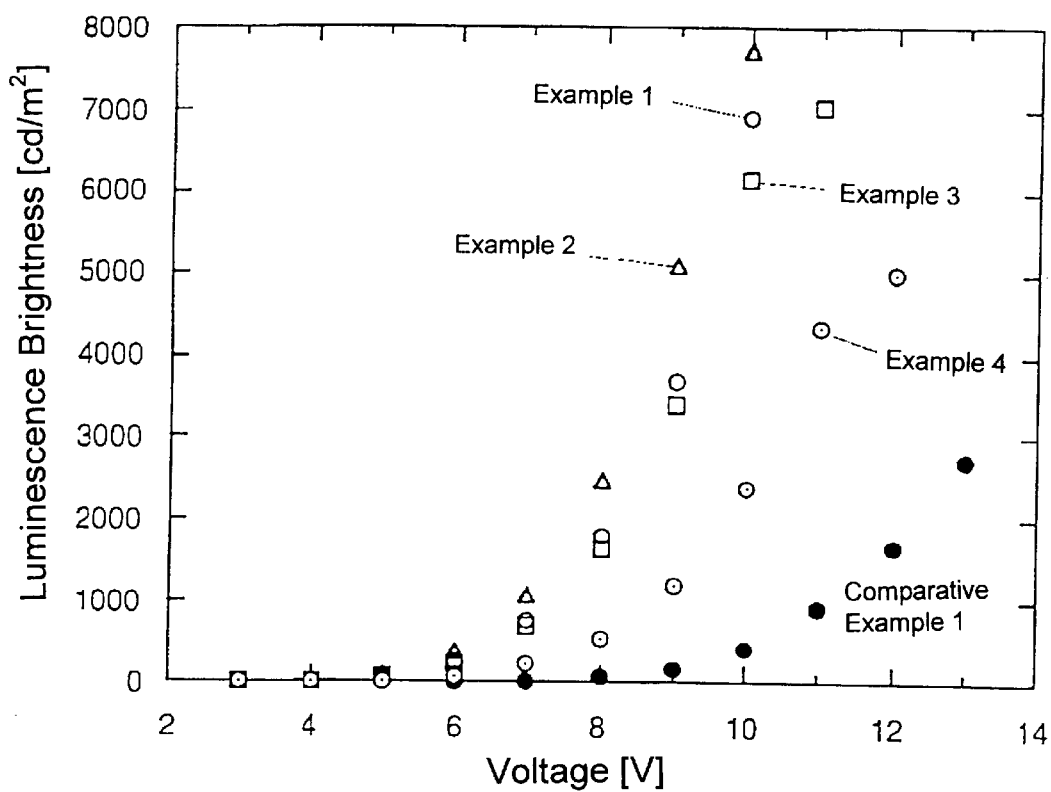
FIG. 6 is a graph showing voltage-brightness characteristics in Examples 1 to 4 and Comparative Example 1.

There was thus obtained an organic electroluminescent device having the size of 2 mm×2 mm. The device was taken out of the vacuum deposition apparatus, and a voltage was applied in the air between the anode and the cathode to determine the luminescence characteristics. The luminescence characteristics of the device are shown in Table 1. In Table 1, the luminescence brightness is a value at a current density of 250 mA/cm², the luminescence efficiency is a value at 100 cd/m², the brightness/current represents the slope of brightness-current density characteristics, and the voltage is a value at 100 cd/m². The voltage-brightness characteristics of the device are shown in the graph of FIG. 6.

As a result of analyses by X-ray photoelectron spectroscopy and SIMS the aluminum cathode layer containing lithium, carbon and oxygen was found to comprise 94.5 at. % of aluminum atoms, 1.0 at. % of carbon atoms, 4.2 at. % of oxygen atoms, and 0.4 at. % of lithium atoms.

Example 2

A device was made in the same manner as in Example 1, except that the cathode layer adjacent to the organic luminescent layer was formed with the deposition rate of the Li organic compound (1-1) being 40% based on aluminum. The luminescence characteristics and the voltage-brightness characteristics of the device are shown in Table 1 and FIG. 6, respectively.

As analyzed in the same manner as in Example 1, the cathode layer formed by simultaneous vacuum deposition of aluminum and the Li organic compound was found to comprise 67.2 at. % of aluminum atoms, 8.1 at. % of carbon atoms, 23.6 at. % of oxygen atoms, and 1.2 at. % of lithium atoms. Ninety percent of the oxygen atoms were found bonded to aluminum.

Example 3

A device was made in the same manner as in Example 1, except for using the Li organic compound (1-2) in place of (1-1). The luminescence characteristics and the voltage-brightness characteristics of the device are shown in Table 1 and FIG. 6, respectively.

Example 4

A device was made in the same manner as in Example 1, except for using the Li organic compound (3-5) in place of (1-1). The luminescence characteristics and the voltage-brightness characteristics of the device are shown in Table 1 and FIG. 6, respectively.

Comparative Example 1

A device was made in the same manner as in Example 1, except that the cathode was formed by vacuum deposition of aluminum alone. The luminescence characteristics and the voltage-brightness characteristics of the device are shown in Table 1 and FIG. 6, respectively.

Example 5

Cathode Containing Substantially No Carbon Atoms

A device having formed thereon layers up to the electron transport layer $3c$ which was prepared in the same manner as in Example 1 was taken out of the vacuum deposition apparatus into the air. A shadow mask for cathode deposition having a 2-mm wide stripe pattern was brought into close contact with the device with its stripes crossing the stripes of the ITO anode 2, and the device with the mask was placed in another vacuum deposition apparatus. The apparatus was evacuated to a degree of vacuum of $2 \times 10^{-6}$ Torr (about $2.7 \times 10^{-4}$ Pa) or less in the same manner as for the organic layer formation. Oxygen gas having a purity of 99.9995% was introduced through a variable leak valve to maintain the inner pressure at $2 \times 10^{-5}$ Torr (about $2.7 \times 10^{-3}$ Pa). A cathode 4 having a thickness of 30 nm was formed by binary simultaneous vacuum deposition using aluminum and lithium nitride as deposition sources. The evaporation time was 2 minutes. The lithium nitride content was 1.5 wt % based on aluminum. Subsequently, without breaking the vacuum of the apparatus, aluminum in a molybdenum boat was evaporated to be further deposited on the aluminum film containing lithium and oxygen to a thickness of 40 nm to complete the cathode 4. The degree of vacuum in the aluminum deposition was $1.5 \times 10^{-5}$ Torr (about $2.0 \times 10^{-3}$ Pa), and the evaporation time was 1 minute and 20 seconds. The substrate was kept at room temperature while the double-layered cathode was being formed by vacuum deposition.

Figure 7:
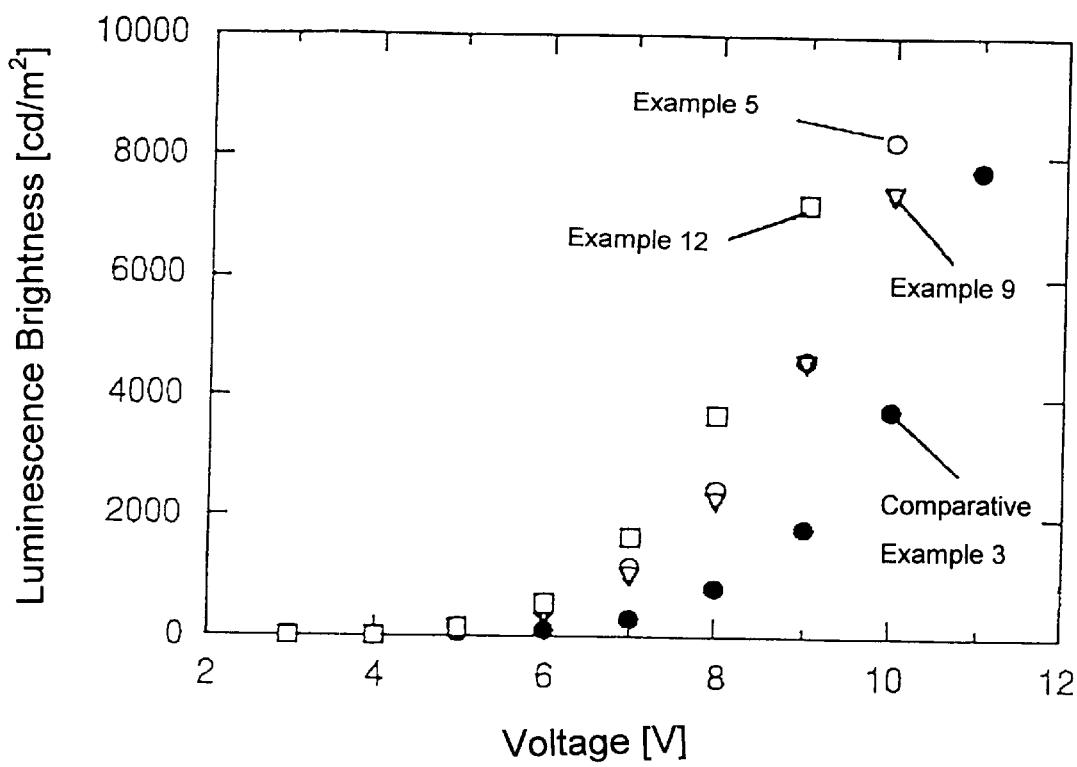
FIG. 7 is a graph showing voltage-brightness characteristics in Examples 5, 9 and 12 and Comparative Example 3.

There was thus obtained an organic electroluminescent device having the size of 2 mm×2 mm. The device was taken out of the vacuum deposition apparatus, and a voltage was applied in the air between the anode and the cathode to determine the luminescence characteristics. The luminescence characteristics of the device are shown in Table 1. In Table 1, the luminescence brightness is a value at a current density of 250 $mA/cm^2$, the luminescence efficiency is a value at 100 $cd/m^2$, the brightness/current represents the slope of brightness-current density characteristics, and the voltage is a value at 100 $cd/m^2$. The voltage-brightness characteristics of the device are shown in the graph of FIG. 7. It is seen from these results that the resulting device emits light at a low voltage with a high brightness at a high luminescence efficiency.

As a result of analyses by X-ray photoelectron spectroscopy and SIMS the aluminum cathode layer containing lithium and oxygen was found to comprise 72 at. % of metallic aluminum atoms, 7 at. % of aluminum atoms in their oxidized state, 18 at. % of oxygen atoms, and 1.5 at. % of lithium atoms.

Examples 6 and 7

A device was prepared in the same manner as in Example 5, except for changing the lithium atom content in the cathode to 3.0 at. % or 8.0 at. %. The luminescence characteristics of the resulting devices are shown in Table 1. It is seen from the results in Table 1 in view of the results of Example 5 that devices of low voltage, high brightness and high luminescence efficiency can be obtained with a broad lithium atom concentration range.

Comparative Example 2

A device was made in the same manner as in Example 5, except that the cathode was formed by binary vacuum deposition of metallic aluminum and metallic lithium without introducing oxygen. Aluminum was put in a molybdenum metal boat. Lithium chromate (an alkali dispenser supplied by SAES Getter S.p.A.) was used as a lithium source. Aluminum deposition was carried out at a deposition rate of 0.5 nm/sec at a degree of vacuum of $1.5 \times 10^{-5}$ Torr (about $2.0 \times 10^{-3}$ Pa) to form a cathode having a thickness of 80 nm and containing 2.4 wt % lithium.

The luminescence characteristics of the device were measured immediately after the preparation and after storage at room temperature in a nitrogen atmosphere for 2 weeks. The results obtained are shown in Table 1. As is apparent from Table 1, the device containing no oxygen in the cathode undergoes noticeable deterioration in luminescence characteristics with time, proving lacing in practicality.

Example 8

Triplet Luminescent Device

A device was prepared in the same manner as in Example 5, except that an electron transport layer $3c$ comprising the above-described host compound (T-3) doped with 5 wt % of the phosphorescent substance (T-2) was formed with a thickness of 30 nm and that a 10 nm thick layer of an aluminum-mixed ligand complex (T-4) shown below and a 35 nm thick layer of an aluminum complex of 8-hydroxyquinoline were formed thereon as an electron injection layer. There was obtained an organic electroluminescent device having a luminescence peak at 512 nm.

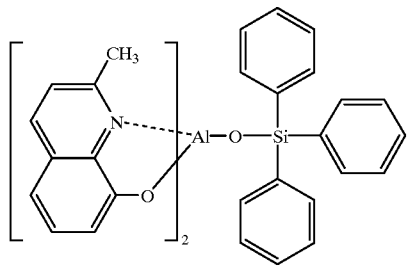

Figure 8:
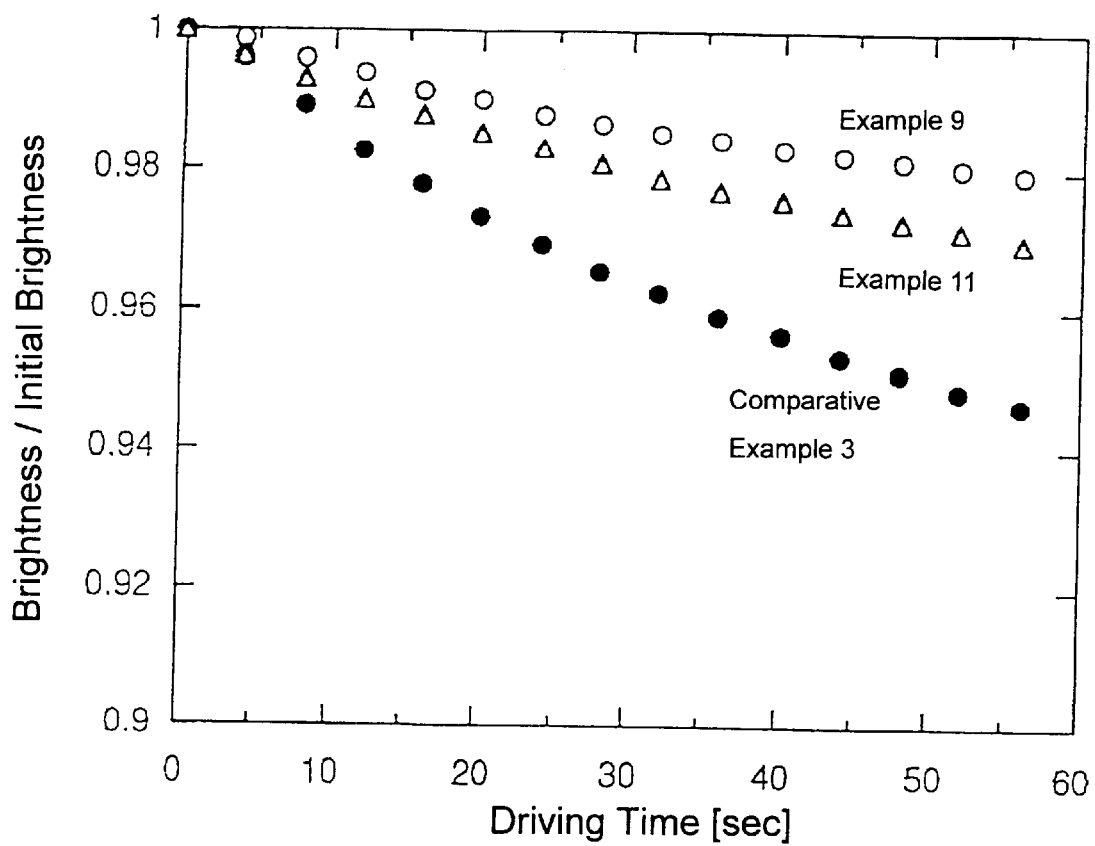
FIG. 8 is a graph showing driving time-brightness characteristics in Examples 9 and 11 and Comparative Example 3.

The luminescence characteristics of the resulting device are shown in Table 1.

aluminum. The luminescence characteristics of the device are shown in Table 2 and the graph in FIG. 7, and the driving results at a high current density are shown in FIG. 8.

These results reveal that the cathode consisting solely of aluminum requires a higher voltage and undergoes deterioration in brightness faster compared with Example 9.

Example 10

After the device prepared in example 6 was stored at room temperature in a nitrogen atmosphere for 2 weeks, the area of non-light-emitting parts was found to be less than 1%, proving the device excellent in storage stability.

Comparative Example 4

The device prepared in Comparative Example 2 was stored in the same manner as in Example 10. As a result, 50% area turned non-luminescent, showing remarkable deterioration due to storage.

Example 11

A device was prepared in the same manner as in Example 5, except that lithium nitride as an alkali metal deposition

TABLE 1

| | Cathode Composition (at.%) | | | | Luminescent Brightness (cd/m$^2$) @250 mA/cm$^2$ | Luminescence Efficiency (1 m/W) @100 cd/m$^2$ | Brightness/ Current (cd/A) | Voltage (V) @100 cd/m$^2$ |
|---|---|---|---|---|---|---|---|---|
| | Metal | Alkali Metal | Carbon | Oxygen | | | | |
| Example 1 | 94.5 | 0.4 | 1.0 | 4.2 | 7130 | 2.03 | 3.3 | 5.2 |
| Example 2 | 67.2 | 1.2 | 8.1 | 23.6 | 7710 | 2.22 | 3.5 | 5.0 |
| Example 3 | | | — | | 7040 | 2.01 | 3.3 | 5.2 |
| Example 4 | | | — | | 5000 | 1.29 | 2.6 | 6.2 |
| Example 5 | 79.0 | 1.5 | 0 | 18.0 | 8340 | 2.67 | 4.0 | 4.7 |
| Example 6 | 77.5 | 3.0 | 0 | 18.0 | 8680 | 2.13 | 3.7 | 5.5 |
| Example 7 | 72.5 | 8.0 | 0 | 18.0 | 7690 | 2.31 | 3.7 | 5.1 |
| Example 8 | 79.0 | 1.5 | 0 | 18.0 | 35510 | 13.4 | 26.0 | 6.1 |
| Compara. Example 1 | | Al | | | 2730 | 0.49 | 1.3 | 8.4 |
| Comparative Example 2 | | | | | | | | |
| Immediately after Preparation | | AlLi | | | 9295 | 2.18 | 4.1 | 6.0 |
| after 2 weeks | | | | | 1513 | 0.23 | 0.88 | 12.0 |

Example 9

Device Having a Cathode Interface Layer

A device was prepared in the same manner as in Example 5, except that the cathode was formed by first providing a 1.5 nm thick lithium fluoride layer on the organic layer and then providing a 40 nm thick cathode layer mainly comprising aluminum and containing 3.0 at. % of lithium. The luminescence characteristics and the voltage-brightness characteristics of the device are shown in Table 2 below and the graph in FIG. 7, respectively. Further, the heat resistance of the device was evaluated in terms of reduction in brightness in driving at as high a current density as 250 mA/cm$^2$. The results are shown in the graph in FIG. 8.

Comparative Example 3

A device was made in the same manner as in Example 9, except that neither lithium nor oxygen was incorporated into source was replaced with lithium oxide and that the cathode was formed at a degree of vacuum of 5×10$^{-6}$ Torr (about 6.7×10$^{-4}$ Pa) without introducing oxygen. The luminescence characteristics of the resulting device are shown in Table 2, proving that the device requires a low voltage and exhibits a high brightness and a high luminescence efficiency. The driving results at a high current density were as shown in FIG. 8.

The cathode composition of the device was found to comprise 52 at. % of aluminum atoms in a metal form, 16 at. % of aluminum atoms in an oxidized form, 29 at. % of oxygen atoms, and 3 at. % of lithium atoms as analyzed in the same manner as in Example 5.

Example 12

A device was made in the same manner as in Example 11, except for replacing lithium oxide as an alkali metal deposition source with sodium oxide. The luminescence characteristics of the device are shown in Table 2, proving that the device emits light at a low voltage with a high brightness and a high luminescence efficiency. The voltage-brightness characteristics of the device were as shown in FIG. 7.

The cathode composition of the device was found to comprise 83 at. % of aluminum atoms in a metal form, 7 at. % of aluminum atoms in an oxidized form, 9 at. % of oxygen atoms, and 0.5 at. % of sodium atoms as analyzed in the same manner as in Example 5. In addition, the state of the sodium atoms was examined by XPS. It was revealed that 30% were in an oxidized state.

TABLE 2

|  | Luminescent Brightness (cd/m$^2$) @ 250 mA/cm$^2$ | Luminescence Efficiency (1 m/W) @ 100 cd/m$^2$ | Brightness/ Current (cd/A) | Voltage (V) @ 100 cd/m$^2$ |
| --- | --- | --- | --- | --- |
| Example 9 | 7330 | 2.24 | 3.6 | 5.0 |
| Example 11 | 9140 | 2.47 | 3.9 | 5.0 |
| Example 12 | 7690 | 2.47 | 3.6 | 4.6 |
| Comparative Example 3 | 7760 | 1.74 | 3.4 | 6.0 |

It is seen from the above results that the present invention provides a device which emits light at a low voltage with a high brightness at a high luminescence efficiency.

INDUSTRIAL APPLICABILITY

As having been fully described, the device according to the present invention of which the cathode comprises a metallic material, an alkali metal, carbon atoms and oxygen atoms emits light at a low voltage with a high brightness at a high efficiency, is stable when driven even at a high current density, and hardly undergoes deterioration while stored.

The process of the invention for producing an organic electroluminescent device in which such a cathode is formed by simultaneous vacuum deposition using a metallic material and an alkali metal-containing organic compound as deposition sources makes it feasible to form a satisfactory cathode without requiring strict process control.

Accordingly, the organic electroluminescent device of the invention is applicable to flat panel displays (e.g., of OA computers and wall TV sets), automotive display devices, cellular phone displays, light sources taking advantage of a planar light-emitter (e.g., a light source of copiers and a backlight of liquid crystal displays or instruments), display boards, and sign lamps, and therefor has a great technical value.

What is claimed is:

1. An organic electroluminescent device, comprising a substrate, an anode and a cathode, and a luminescent layer provided between the anode and cathode, wherein the cathode comprises an aluminum or an aluminum alloy content of about 50 to 95 at %, an alkali metal content of about 0.1 to 20 at % and oxygen atoms content of about 1 to 40 at. %.

2. The organic electroluminescent device of claim 1, wherein said cathode further comprises up to 30 at. % of carbon atoms.

3. The organic electroluminescent device of claim 2, wherein said alkali metal and said carbon atoms are present in a form of an organo-complex of an alkali metal.

4. The organic electroluminescent device of claim 1, wherein said cathode has an aluminum or aluminum alloy content of about 60 to 90 at. %.

5. The organic electroluminescent device of claim 1, wherein said cathode has an alkali metal content of about 0.2 to 10 at %.

6. The organic electroluminescent device of claim 1, wherein said cathode has an oxygen atom content of about 3 to 30 at. %.

7. The organic electroluminescent device of claim 1, wherein said cathode has a carbon atom content of not more than 10 at. %.

8. The organic electroluminescent device of claim 1, wherein said alkali metal is selected from the group consisting of lithium, sodium, potassium, and cesium.

9. The organic electroluminescent device of claim 8, wherein said alkali metal is lithium or sodium.

10. The organic electroluminescent device of claim 1, wherein said luminescent layer comprises an aluminum complex of 9-hydroxyquinoline.

11. The organic electroluminescent device of claim 1, wherein said substrate comprises quartz, glass, metal or resin.

12. The organic electroluminescent device of claim 11, wherein said substrate is resin, which is transparent.

13. The organic electroluminescent device of claim 12, wherein said transparent resin is selected from the group consisting of polyester, polymethacrylate, polycarbonate and polysulfone.

14. The organic electroluminescent device of claim 1, wherein said anode comprises aluminum, gold, silver, nickel, palladium, platinum, oxides of tin or indium, copper iodide, carbon black or an electrically-conductive polymer.

15. The organic electroluminescent device of claim 14, wherein said electrically-conductive polymer comprises polyaniline, polypyrrole or poly(3-methylthiophene).

16. The organic electroluminescent device of claim 1, wherein the luminescent layer comprises an electron transport layer and a hole transport layer.

17. The organic electroluminescent device of claim 16, wherein said anode is on said substrate, said hole transport layer is on said anode, said electrode transport layer is on said hole transport layer, and said cathode is on said electron transport layer.

18. The organic electroluminescent device of claim 17, which further comprises an anode buffer layer between the anode and the hole transport layer.

19. The organic electroluminescent device of claim 18, which further comprises a protective layer on a side of the cathode opposite to the luminescent layer.

20. The electroluminescent device of claim 1, wherein said anode is on said substrate, said luminescent layer is on said anode, and said cathode is on said luminescent layer.

21. The organic electroluminescent device of claim 1, wherein a layer of aluminum or aluminum alloy free of alkali metal is provided on a side of said cathode opposite to the luminescent layer.

22. A process for producing the organic electroluminescent device of claim 1, which comprises a step of forming said cathode by reactive vacuum deposition in an oxidizing atmosphere using aluminum or an aluminum alloy and an alkali metal as deposition sources.

23. A process for producing the organic electroluminescent device of claim 1, which comprises a step of forming said cathode by reactive sputtering using aluminum or an aluminum alloy and an alkali metal as a target in an oxidizing atmosphere.

24. A process for producing the organic electroluminescent device of claim 1, which comprises a step of forming said cathode by sputtering using aluminum or an aluminum alloy, an alkali metal and oxygen atoms as a target.

25. A process for producing the organic electroluminescent device of claim 1, which comprises a step of forming said cathode by vacuum deposition using aluminum or aluminum alloy and an alkali metal oxide as deposition sources.

26. The process of claim 25, wherein an alkali metal nitride is used as the alkali metal deposition source.

27. The process of claim 25, which comprises a step of forming said cathode by simultaneous vacuum deposition using aluminum or an aluminum alloy and an alkali metal-containing organic compound as deposition sources.

* * * * *